United States Patent [19]
Aizaki

[11] Patent Number: 5,932,884
[45] Date of Patent: Aug. 3, 1999

[54] CHARGED-BEAM EXPOSURE SYSTEM AND CHARGED-BEAM EXPOSURE METHOD

[75] Inventor: Naoaki Aizaki, Tokyo, Japan

[73] Assignee: NEC Corporation, Tokyo, Japan

[21] Appl. No.: 08/827,088

[22] Filed: Mar. 27, 1997

[30] Foreign Application Priority Data

Mar. 28, 1996 [JP] Japan ................................. 8-074086

[51] Int. Cl.$^6$ .............................................. H01J 37/304
[52] U.S. Cl. ............................... 250/492.23; 250/492.22
[58] Field of Search ......................... 250/492.23, 492.22, 250/398

[56] References Cited

U.S. PATENT DOCUMENTS 5,334,282  8/1994  Nakayama et al. ................ 250/492.23

FOREIGN PATENT DOCUMENTS

| 52-119185 | 10/1977 | Japan . |
| A 63-119530 | 5/1988 | Japan . |
| A 3-14219 | 1/1991 | Japan . |
| 4-137520 | 5/1992 | Japan . |

OTHER PUBLICATIONS

Yamashita et al., "Resolution analysis in electron–beam cell projection lithography system", *J. Vac. Sci. Technol.*, vol. B 13, No. 6, Nov./Dec. 1995, pp. 2473–2477.

Yamashita et al., "Coulomb Interaction Effect in Cell Projection Lithography", *Digest of Papers of the 8th International Microprocess Conference*, 1995, pp. 202–204.

Matsuzaka et al., "Study of EB Cell Projection Lithography (I): Electron Optics", *Extended Abstracts of the 50th Autumn Meeting of the Japan Society of Applied Physics*, 27a–K–6, 1989, pp. 452.

Nakayama et al., "Study of EB Cell Projection Lithography (II): Fabrication of Si Aperture", *Extended Abstracts of the 50th Autumn Meeting of the Japan Society of Applied Physics*, 27a–K–7, 1989, p. 452.

*Primary Examiner*—Kiet T. Nguyen
*Attorney, Agent, or Firm*—Sughrue, Mion, Zinn, Macpeak & Seas, PLLC

[57] ABSTRACT

A charge-beam exposure system is provided, which is able to adjust the current density of a charged beam according to the opening-area ratio of shaping apertures without the use of current-density adjusting apertures. The system includes a first aperture formed on a first aperture mask and second apertures formed on a second aperture mask. A current-density controller controls the current density of the charged beam. A second-aperture selector selects one of the second apertures. An exposure-time controller controls the exposure time of a specimen to the charged beam. A current detector detects an electric current generated by the charged beam. A correction data generator generates a correction data to limit the electric current to a preset value or less. The charged beam passes through the first aperture to have a shape of the first aperture. The charged beam having the shape of the first aperture passes through a selected one of the second apertures to have a composite shape of the first aperture and the selected one of the second apertures. The charged beam having the composite shape is irradiated onto a specimen to form an image of the composite shape.

4 Claims, 6 Drawing Sheets

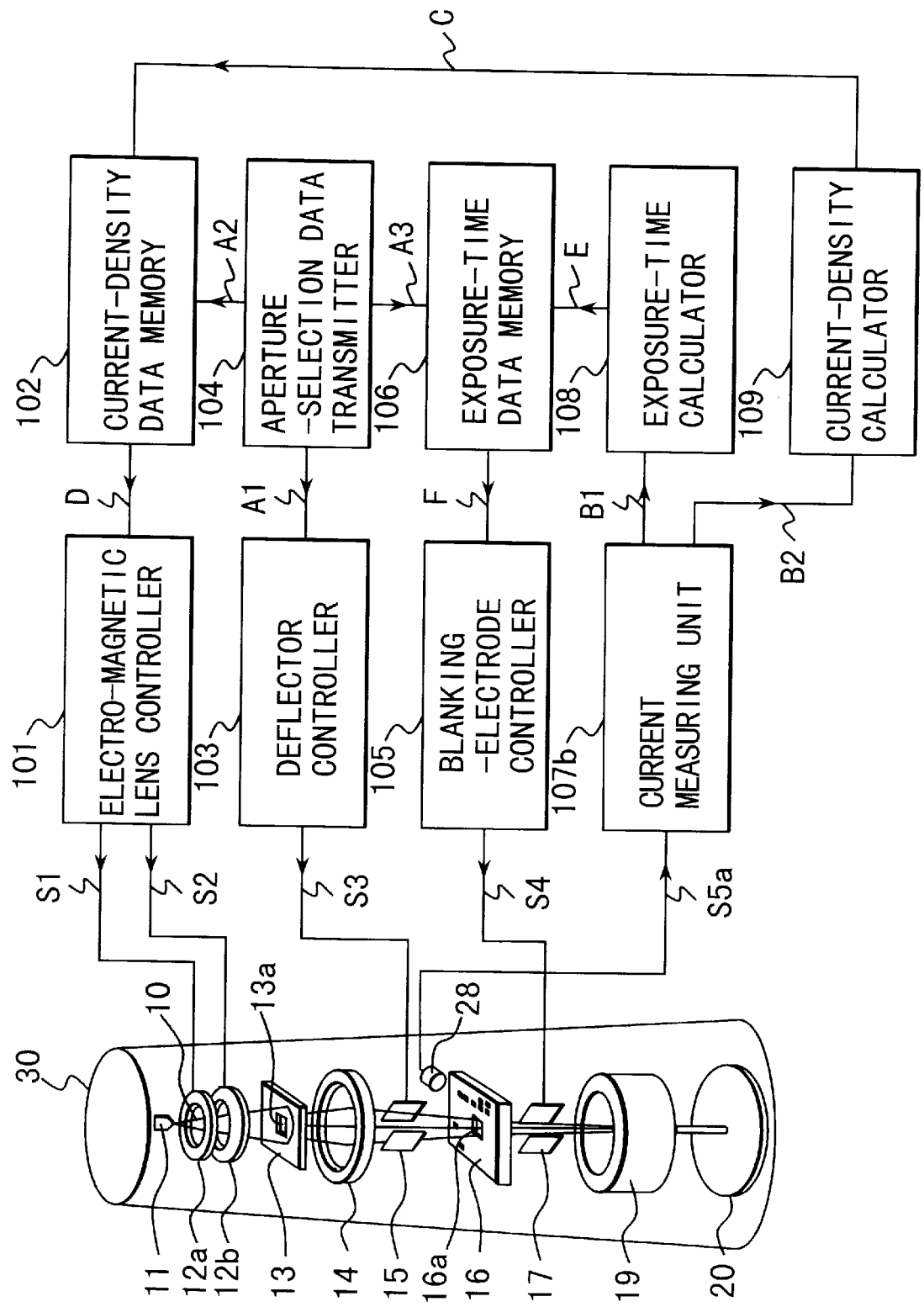

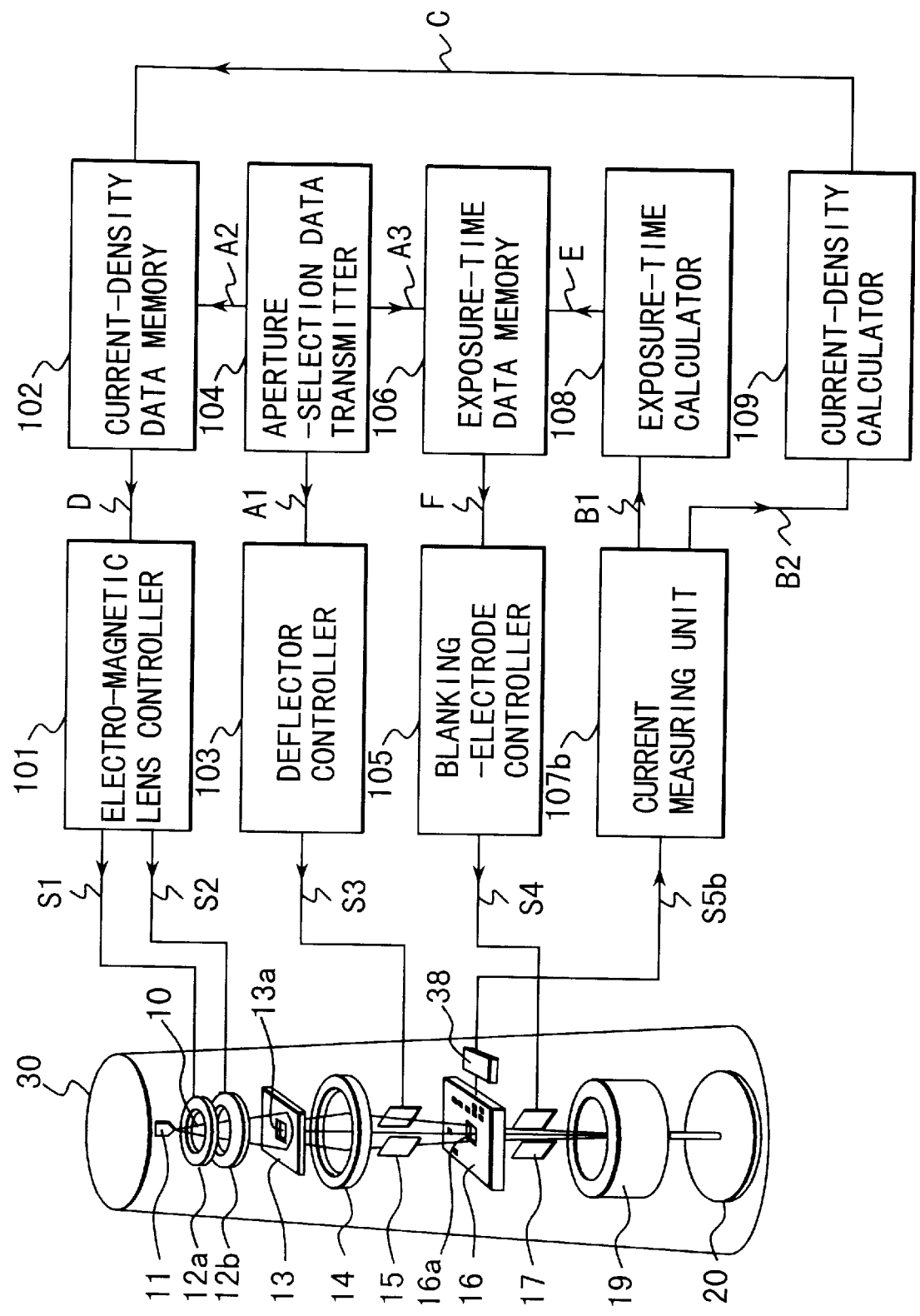

CHARGED-BEAM EXPOSURE SYSTEM AND CHARGED-BEAM EXPOSURE METHOD

BACKGROUND OF THE INVENTION

1. Field of the Invention

The present invention relates to an exposure technique used for fabricating semiconductor integrated circuits (ICs) and for fabricating masks for pattern transfer of the ICs and more particularly, to a charged-beam cell projection exposure system and a charged-beam cell projection exposure method using a beam of charged particles such as electrons or ions and an aperture mask with a plurality of different, shaped apertures for shaping the beam.

2. Description of the Prior Art

In recent years, to provide higher densities and higher operation speeds for semiconductor ICs, the dimensions of the devices and/or components in the semiconductor ICs have been continuously miniaturized.

To realize the miniaturization of the device/component dimensions, with the conventional optical exposure systems utilizing Ultra Violet (UV) light, such improvements as the use of light having a shorter wavelength, the increase in Numerical Aperture (NA), the modified illumination, and others have been made. At the same time, new types of the optical exposure method using the phase-shifting mask and others have been developed.

Further, the development of new types of the exposure other than the optical exposure, such as the an electron-beam or X-ray exposure, has been progressed.

For the semiconductor ICs having fine patterns, such as 256-Mbit Dynamic Random Access Memories (DRAMs), a variety of exposure techniques using an electron beam have been developed.

These exposure systems using the electron beam can be classified into two basic types: point beam and variable-shaped beam ones.

With the electron-beam exposure system of the point beam type, a pattern to be transferred on a resist-coated semiconductor wafer is divided into small unit regions, and the point beam of electrons is deflected for scanning, thereby writing the pattern on the resist-coated wafer in serial fashion.

On the other hand, with the electron-beam exposure system of the variable-shaped beam type, a pattern to be transferred is divided into small unit rectangular regions. The electron beam giving a rectangular-shaped beam spot with a size and a shape corresponding to those of the unit regions is prepared and deflected for scanning, thereby writing the pattern on the resist-coated wafer in serial fashion.

Thus, these conventional electron-beam exposure systems require a long period of time for exposure. For example, the required exposure time for the above-mentioned 256-Mbit DRAMs is approximately as long as 10 minutes per chip. This is approximately 100 times the exposure time needed with the conventional optical exposure system using UV light.

Additionally, the conventional electron-beam exposure systems of these two types have a drawback that they are expensive compared with the conventional optical exposure systems.

To shorten the necessary exposure time, an improved electron-beam exposure method was developed, which was termed the "electron-beam cell projection exposure method".

This improved exposure method was disclosed in (a) the Japanese Non-Examined Patent Publication No. 52-119185 published in 1977, (b) the Extended Abstracts of the 50 th Autumn Meeting of the Japan Society of Applied Physics, 27a-K-6, pp. 452, 1989, entitled "Study of EB Cell Projection Lithography (I): Electron Optics", written by T. Matsuzaka et al., and (c) the Extended Abstracts of the 50 th Autumn Meeting of the Japan Society of Applied Physics, 27a-K-7, pp. 452, 1989, entitled "Study of EB Cell Projection Lithography (II): Fabrication of Si Aperture", written by Y. Nakayama et al..

In the improved exposure method termed the "electron-beam cell projection" exposure method, the pattern to be transferred is divided into repetitive unit or cell regions, and an aperture with a shape and a size corresponding to those of the cell regions is formed on an aperture mask. The electron-beam is shaped by passing through the aperture according to the unit regions, and is irradiated onto the resist-coated semiconductor wafer.

Specifically, an electron beam is irradiated to a rectangular first aperture formed on a first aperture mask, thereby shaping the beam into a rectangle. On the other hand, the pattern of a semiconductor chip to be transferred is divided into various repetitive cell regions, and various second apertures with sizes and shapes corresponding to those of the cell regions are formed on a second aperture mask. Any one of the second apertures is selectively used.

The rectangular-shaped electron beam by passing through the first aperture on the first aperture mask is irradiated to a selected one of the second apertures on the second mask, thereby forming a composite, shaped beam. The composite, shaped beam is then irradiated onto the resist-coated wafer, thereby making a spot with the composite shape on the wafer. Thus, the irradiated area of the wafer is exposed to the electron beam at a time.

The sizes of the second apertures are determined in such a way that the shaped spot formed on the wafer has a substantially uniform current density within the whole spot.

With the conventional electron-beam cell projection exposure method, the composite-shaped spot of the electron beam (i.e., the composite image of the first aperture and the selected one of the second apertures) is made on the resist-coated wafer at a single shot and therefore, the necessary exposure time for the chip pattern can be shortened.

An exposure system for performing the conventional "electron-beam cell projection" exposure method, which is capable of mass production, has been being developed, because the necessary electron optical system and the necessary aperture-mask configuration are able to be realized. An example of this system is shown in FIG. 1.

In FIG. 1, an electron beam 40, which has been emitted from an electron gun 41 as an electron source, is shaped into a rectangle by irradiating the beam 40 to a first aperture 43a on a first aperture mask 43. The rectangular-shaped beam 40 is then transmitted through a first shaping lens 44a, a deflector 45, and a second shaping lens 44b to be irradiated toward a second aperture mask 46 having shaped second apertures 46a.

The rectangular-shaped beam 40 is selectively irradiated to a selected one of the shaped second apertures 46a on the second aperture mask 46, thereby shaping the beam 40 into the shape of the selected second aperture 46a. Thus, the beam 40 is shaped into a composite shape of the first aperture 43a and the selected second aperture 46a.

The electron beam 40 with the composite shape is then reduction-projected onto a resist-coated semiconductor wafer 50 by means of a reduction lens 49a and a projection lens 49b. Thus, an image of the composite shape of the first and second apertures 43a and 46a is made on the electron resist film (not shown) on the wafer 50.

With the conventional electron-beam cell projection exposure system of FIG. 1, however, there is a problem that no fine pattern may be able to be formed on the resist film on the wafer 50. This is caused by the fact that the opening-area ratio of the selected one of the second apertures 46a maybe excessively large depending upon the type of the pattern to be transferred and as a result, the blur of the electron beam 40 with the composite shape will increase up to a level where the effects of the blur cannot be ignored due to the Coulomb interaction effect.

It is known that the strength of the Coulomb interaction effect increases with the increasing magnitude of the current density of the transmitted electron beam 40. Therefore, the above problem relating to the fine patterns can be solved if the current density of the beam 40 is designed to be adjusted in such a way that the beam 40 passing through a particular one of the second apertures 46a with the maximum opening-area ratio has a sufficiently low blur.

However, when exposing a cell region of the pattern to be transferred with a sufficiently-low opening-area ratio, it is preferred that the current density is as large as possible, because the necessary exposure time can be shortened. The shortened exposure time improves the total processing capacity of the exposure system of FIG. 1.

Therefore, to improve the total processing capacity of the conventional system of FIG. 1, it is necessary to adjust or change the current density of the electron beam 40 according to the opening-area ratio for the cell regions to be transferred.

To realize the current-density adjustment of the electron beam 40 according to the opening-area ratio for the cell regions to be transferred, an exposure system disclosed in the Japanese Non-Examined Patent Publication No. 4-137520 published in 1992 is available.

FIG. 2 shows the conventional exposure system disclosed in the Japanese Non-Examined Patent Publication No. 4-137520.

In the exposure system of FIG. 2, an electron beam 50, which has been emitted from an electron gun 51, is shaped into a rectangle by irradiating the beam 50 to a first rectangular aperture on a first aperture mask 53. The rectangular-shaped beam 50 is then transmitted through a first shaping lens 54a, a deflector 55, and a second shaping lens 54b, and is irradiated toward a second aperture mask 56 having shaped second apertures. The above configuration is the same as that of the conventional exposure system of FIG. 1.

However, a third aperture mask 66 and driving motors 67 are additionally provided in the system of FIG. 2 between the second shaping lens 54b and the second aperture mask 56.

The third aperture mask 66 has a plurality of meshed third apertures 66a, and serves to adjust the current density of the electron beam 50. The third apertures 66a of the third aperture mask 66 have different-sized meshes for the current densities from 100% to 50% in decrements of 10%. The motors 67 serve to translate the mask 66 in a plane perpendicular to the electron beam 50 in order to select one of the meshed apertures 66a.

The rectangular-shaped beam 50 having passed through the selected one of the third apertures 66a on the third aperture mask 66 is selectively irradiated to a selected one of the shaped second apertures on the second aperture mask 56, thereby shaping the beam 50 into a composite shape of the first aperture and the selected second aperture.

The electron beam 50 with the composite shape and the adjusted current density is then reduction-projected onto a resist-coated semiconductor wafer 60 by means of a reduction lens 59a and a projection lens 59b. Thus, an image of the composite shape of the first and second apertures is made on the resist (not shown) on the wafer 60.

In the Japanese Non-examined Patent Publication No. 4-137520, it is not explicitly stated that at which stage the selection of a particular one of the meshed third apertures 66a is determined. It is supposed that the determination of the apertures 66a is made at the stage of preparing the exposure data for the shaped apertures on the second aperture mask 56 according to their opening-area ratios.

Further, in the Japanese Non-examined Patent Publication No. 4-137520, it is disclosed that the meshed apertures 66a on the third aperture mask 66 may be directly formed on the first or second aperture masks 53 or 56. In this case, it is necessary to determine the proper mesh size and the layout of the apertures 66a prior to formation of the first or second aperture mask 53 or 56, respectively.

As described above, the conventional exposure system of FIG. 2, which was disclosed in the Japanese Non-Examined Patent Publication No. 4-137520, has the following problems:

First, various meshed apertures 66a need to be prepared on the corresponding aperture mask 66 according to the whole adjusting range of the current density.

Second, it is disclosed in the Japanese Non-examined Patent Publication No. 4-137520 that the meshes for adjusting the current density are designed to have a linewidth of 2.5 $\mu$m or less. However, considering the further miniaturization of the patterns to be transferred in the future, the meshes need to have the linewidth of 1 or 0.5 $\mu$m or less. Such extremely fine meshes are very difficult to be fabricated consistently, which substantially lowers the fabrication yield and greatly increases the fabrication cost.

Third, to automatically select a proper one of the current-density adjusting apertures 66a when the shaped apertures on the second aperture mask 56 are changed or replaced to be used from one to another, the determination or selection of the apertures 66a for adjusting the current density of the electron beam 50 needs to be made at the stage of preparing the exposure data for the shaped apertures on the second aperture mask 56 according to their opening-area ratios.

SUMMARY OF THE INVENTION

Accordingly, an object of the present invention is to provide a charged-beam exposure system and a charged-beam exposure method that is able to transfer a fine pattern onto a specimen without the use of current-density adjusting apertures.

Another object of the present invention is to provide a charged-beam exposure system and a charged-beam exposure method that is able to continuously change the current density of the charged beam.

Still another object of the present invention is to provide a charged-beam exposure system and a charged-beam exposure method that allows to prepare the data for correcting the current density of a charged beam and an necessary exposure time according to the shaping apertures just before the exposure process.

The objects together with others not specifically mentioned will become clear to those skilled in the art from the following description.

According to a first aspect of the present invention, a charged-beam exposure system is provided. In this system, a charged beam is emitted from a charged-beam source. A first aperture for shaping the charged beam into a first shape is formed on a first aperture mask. Second apertures for selectively shaping the charged beam into second shapes are formed on a second aperture mask.

The system further includes a current-density controller for controlling the current density of the charged beam, a second-aperture selector for selecting one of the second apertures, an exposure-time controller for controlling the exposure time of a specimen to the charged beam, a current detector for detecting an electric current generated by the charged beam, and a correction data generator for generating a current-density correction data and an exposure-time correction data.

The charged beam is irradiated to the first aperture to be shaped into the first shape. The charged beam shaped into the first shape is further irradiated to a selected one of the second apertures to be shaped into a corresponding one of the second shapes, thereby shaping the charged beam into a composite shape of the first aperture and the selected one of the second apertures. The charged beam shaped into the composite shape is irradiated to the specimen to form an image of the composite shape on the specimen.

When the value of the detected electric current by the current detector exceeds a preset value, the correction data generator generates the current-density correction data and the exposure-time correction data in such a way that the current density of the charged beam is decreased to the preset value or less and the exposure time of the specimen is increased to keep the amount of exposure substantially unchanged.

The current density controller controls the current density of the charged beam according to the current-density correction data. The exposure-time controller controls the exposure time of the specimen according to the exposure-time correction data.

With the charged-beam exposure system according to the first aspect of the invention, when the value of the detected electric current by the current detector exceeds the preset value, the correction data generator generates the current-density correction data and the exposure-time correction data in such a way that the current density of the charged beam is decreased to the preset value or less and the exposure time of the specimen is increased to keep the amount of exposure substantially unchanged.

The current density controller controls the current density of the charged beam according to the current-density correction data. At the same time, the exposure-time controller controls the exposure time of the specimen according to the exposure-time correction data.

Accordingly, a fine pattern is able to be transferred onto the specimen without the use of current-density adjusting apertures which are difficult to be fabricated and high in cost.

Also, the current density of the charged beam is adjusted or changed by the current-density controller based on the current-density correction data. Therefore, the current density of the charged beam can be changed continuously.

Further, the current-density correction data and the exposure-time correction data are generated by the correction data generator through the detection of the current density of the charged beam for any selected one of the second apertures. This means that preparation of the data for correcting the current density of the charged beam and the data for correcting the necessary exposure time is allowed to be performed just before the exposure process.

In the exposure system according to the first aspect, as the electric current detector, a Faraday cup or an ammeter is preferably used. A resist-coated semiconductor wafer, or a mask or reticle is typically used as the specimen. As the charged beam, a beam of electrons or ions are preferably used.

According to a second aspect of the present invention, a charged-beam exposure method is provided, which is comprised of the following steps.

(a) An electric current generated by the charged beam is detected prior to exposure of the specimen.

(b) The value of the detected electric current is compared with a preset value.

(c) A current-density correction data and an exposure-time correction data are generated in such a way that the current density of the charged beam is decreased to the preset value or less and the exposure time of the specimen is increased to keep the amount of exposure unchanged, when the value of the detected electric current exceeds the preset value.

(d) The current density of the charged beam and the exposure time of the specimen are corrected according to the current-density correction data and the exposure-time correction data, respectively.

(e) The charged beam is irradiated to the specimen at the corrected current density for the corrected exposure time.

With the charged-beam exposure method according to the second aspect of the present invention, the electric current generated by the charged beam is detected prior to exposure of the specimen, and then, the value of the detected electric current is compared with a preset value.

When the value of the detected electric current exceeds the preset value, the current-density correction data and the exposure-time correction data are generated in such a way that the current density of the charged beam is decreased to the preset value or less and the exposure time of the specimen is increased to keep the amount of exposure unchanged.

Then, according to the current-density correction data and the exposure-time correction data, the current density of the charged beam and the exposure time of the specimen are corrected, respectively. Following this, the charged beam is irradiated to the specimen at the corrected current density for the corrected exposure time.

Accordingly, a fine pattern is able to be transferred onto the specimen without the use of current-density adjusting apertures which are difficult to be fabricated and high in cost. Also, the current density of the charged beam can be changed continuously. Further, the data for correcting the current density of the charged beam and the data for correcting the necessary exposure time are allowed to be prepared just before the exposure process.

In the exposure method according to the second aspect, a resist-coated semiconductor wafer, or a mask or reticle is typically used as the specimen. As the charged beam, a beam of electrons or ions are preferably used. The electric current is preferably detected with the use of a Faraday cup or an ammeter.

BRIEF DESCRIPTION OF THE DRAWINGS

In order that the invention may be readily carried into effect, it will now be described with reference to the accompanying drawings.

FIG. 5 is a schematic view showing the configuration of an electron-beam exposure system according to a second embodiment of the present invention.

FIG. 6 is a schematic view showing the configuration of an electron-beam exposure system according to a third embodiment of the present invention.

DETAILED DESCRIPTION OF THE PREFERRED EMBODIMENTS

Figure 1:
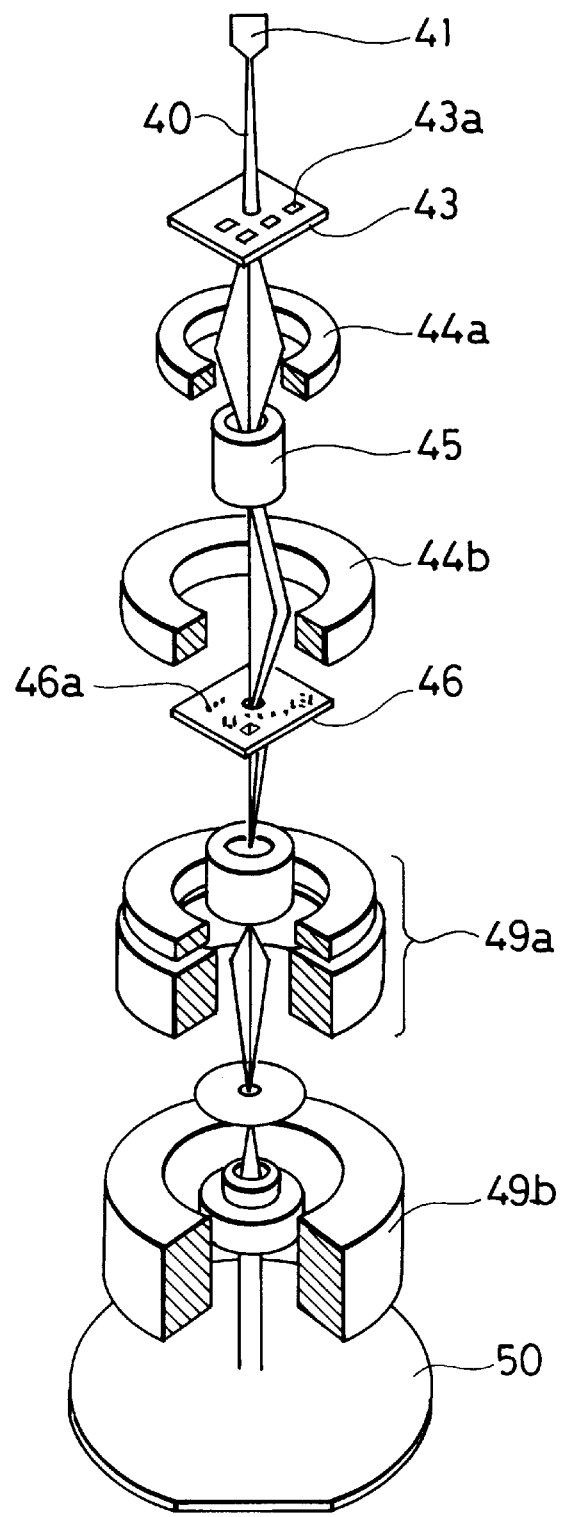
FIG. 1 is a schematic view showing the configuration of a conventional electron-beam exposure system.
Figure 2:
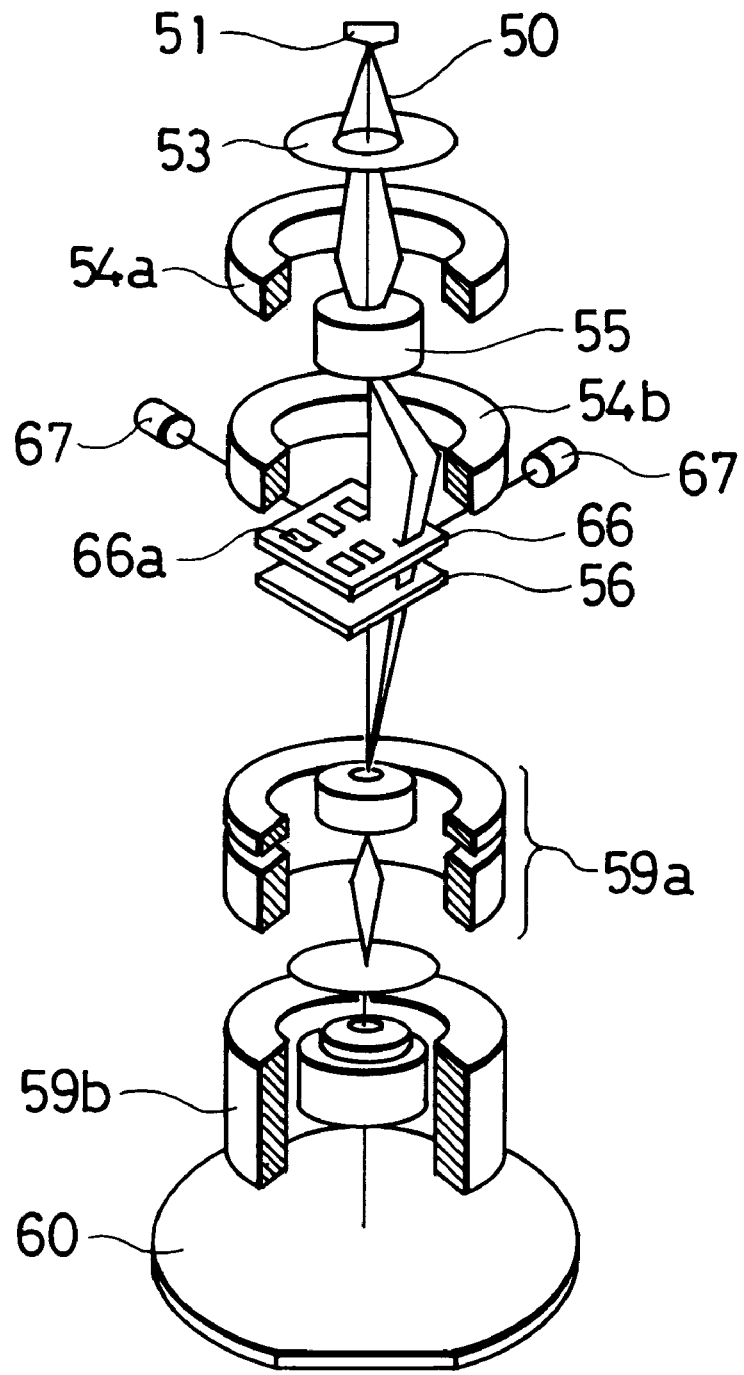
FIG. 2 is a schematic view showing the configuration of another conventional electron-beam exposure system.

Preferred embodiments of the present invention will be described in detail below while referring to the drawings attached.

FIRST EMBODIMENT

Figure 3:
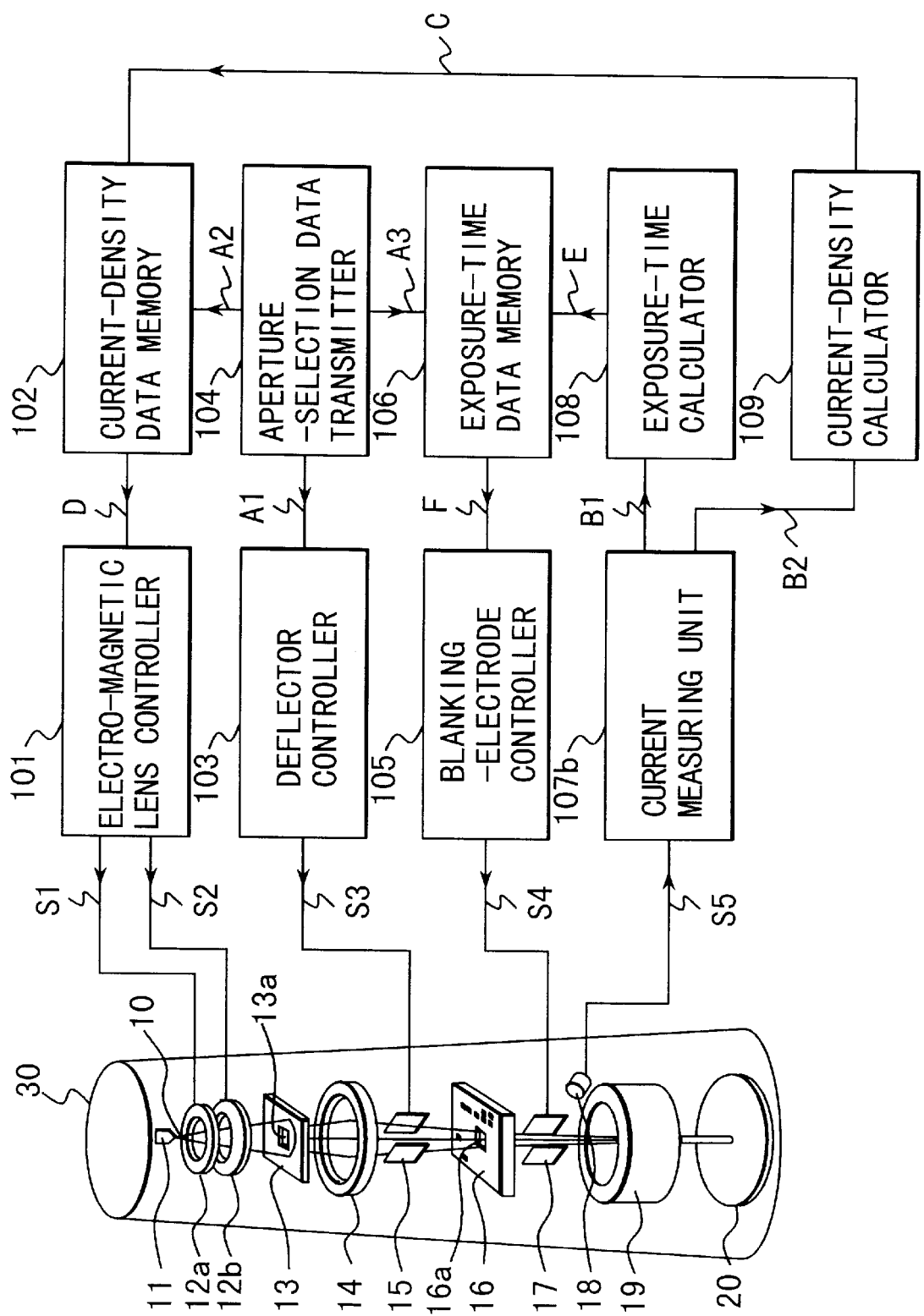
FIG. 3 is a schematic view showing the configuration of an electron-beam exposure system according to a first embodiment of the present invention.

An electron-beam cell projection exposure system according to a first embodiment is shown in FIG. 3.

As shown in FIG. 3, the system has an electron gun 11 serving as an electron source, a pair of electromagnetic lenses 12a and 12b, a first aperture mask 13 having a rectangular aperture 13a, a shaping lens 14, an electrostatic deflector 15, a second aperture mask 16 having a plurality of apertures 16a with different shapes, different sizes, and different opening-area ratios, blanking electrodes 17, a Faraday cup 18, and a reduction-projection lens system 19, which are located in an electron optical column 30.

As a specimen, a semiconductor wafer 20 whose surface is coated by an electron resist film (not shown) is placed at a specific position in the column 30 just beneath the reduction-projection lens system 19.

An electron beam 10, which has been emitted from the electron gun 11, is irradiated to the rectangular aperture 13a on the first aperture mask 13, thereby shaping the beam 10 into a rectangle. The rectangular-shaped beam 10 is then transmitted through the shaping lens 14 and the deflector 15, and is irradiated toward the second aperture mask 16.

The rectangular-shaped beam 10 is irradiated to a selected one of the apertures 16a on the second aperture mask 16, thereby shaping the beam 10 into a composite shape of the rectangular aperture 13a and the selected one of the apertures 16a.

The electron beam 10 shaped into the composite shape is transmitted through the blanking electrodes 17, and is then reduced and projected onto the resist-coated semiconductor wafer 20 by means of the reduction-projection lens system 19.

Thus, an image of the composite shape of the first and second apertures 13a and 16a is made on the resist film on the wafer 20.

Further, the electron-beam exposure system according to the first embodiment of FIG. 3 includes the following controller subsystems.

An aperture-selection data transmitter 104 transmits signals A1, A2, and A3 according to a specific aperture-selection data to a deflector controller 103, a current-density data memory 102, and an exposure-time data memory 106, respectively.

The current-density data thus sent is stored in the current-density data memory 102. The data stored in the memory 102 is then sent to an electromagnetic lens controller 101 as a signal D. On the other hand, the exposure-time data thus sent is stored in the exposure-time data memory 106. The data stored in the memory 106 is then sent to a blanking-electrode controller 105 as a signal F.

The electro-magnetic lens controller 101 controls the pair of electro-magnetic lenses 12a and 12b according to the signal D sent from the current-density data memory 102, thereby adjusting the diameter of the electron beam 10 emitted from the electron gun 11. The upper lens 12a serves to enlarge the diameter of the beam 10, and the lower lens 12b serves to reduce the diameter thereof. These services are performed according to the control signals S1 and S2 sent from the controller 101, respectively.

The pair of the electromagnetic lenses 12a and 12b and the electromagnetic lens controller 101 provide a function of controlling the current density of the emitted electron beam 10.

The deflector controller 103 controls the electrostatic deflector 15 by a signal S3 to thereby irradiate the electron beam 10 to a selected one of the apertures 16a on the second aperture mask 16 according to the signal A1. Thus, the rectangular-shaped electron beam 10 is shaped into the shape of the selected aperture 16a. In other words, the beam 10 is shaped into a composite shape of the aperture 13a on the first aperture mask 13 and the selected aperture 16a on the second aperture mask 16.

The deflector 15 and the deflector controller 103 provide a function of selecting one of the apertures 16a on the second aperture 16.

The blanking-electrode controller 105 controls the blanking electrodes 17 according to the signal F to thereby turn on or off the composite-shaped electron beam 10 by a control signal S4. Thus, the exposure of the wafer 20 to the electron beam 10 is started and stopped.

The blanking electrodes 17 and the blanking-electrode controller 105 provide a function of adjusting the exposure time of the wafer 20 to the electron beam 10.

The Faraday cup 16 traps the electrons in the electron beam 10 under application of a proper voltage, and sends a signal S5 to a current measuring unit 107 according to the amount of the trapped electrons. In other words, the Faraday cup 18 serves as a detector of the electron beam 10 or the electric current due to the beam 10.

The current measuring unit 107 measures an electric current generated by the electron beam 10 based on the signal S5. The unit 107 outputs signals B1 and B2 according to the measured electric current to an exposure-time calculator 108 and a current-density calculator 109, respectively.

The Faraday cup 18 and the current measuring unit 107 provide a function of measuring the electric current due to the electron beam 10.

The current measuring unit 107 judges whether the value I of the measured electric current exceeds a preset value $I_{PRESET}$ or not. The preset value $I_{PRESET}$ is determined in such a way that the blur of the electron beam 10 transmitted through the selected aperture 16a on the second aperture mask 16 is kept at a level where the effects of the blur can be ignored even if the Coulomb interaction effect.

When the value I of the measured electric current exceeds the preset value $I_{PRESET}$, (i.e., $I > I_{PRESET}$), the current measuring unit 107 sends the signals B1 and B2 to the exposure-time calculator 108 and the current-density calculator 109, respectively. When the value I of the measured electric current does not exceed the preset value $I_{PRESET}$, (i.e., $I \leq I_{PRESET}$), the current measuring unit 107 sends no signals to the exposure-time calculator 108 and the current-density calculator 109.

If the exposure-time calculator 102 is applied with the signal B1, it calculates the necessary exposure time and generates an exposure-time correction data according to the received signal B1. The exposure-time correction data is outputted to the exposure-time data memory 106 as a signal E, and stored therein.

If the current-density calculator 109 is applied with the signal B2, it calculates the necessary current density of the electron beam 10 and generates a current-density correction data according to the received signal B2. The current-density correction data is outputted to the current-density data memory 102 as a signal C, and stored therein.

The current-density correction data stored in the current-density data memory 102 is readout by the electromagnetic lens controller 101, thereby correcting the current density of the electron beam 10 according to the signal A2 prior to an exposure process. At the same time, the exposure-time correction data stored in the exposure-time data memory 108 is read out by the blanking-electrode controller 105, thereby correcting the exposure time of the wafer 20 according to the signal A3.

Next, an exposure method using the exposure system of FIG. 3 is explained below with reference to FIG. 4.

Prior to the exposure process, first, a wanted one of the apertures 16a on the second aperture mask 16 is selected (step S101). Next, the electron beam 10 is emitted from the electron gun 11 (step S102), and the electric current generated by the beam 10 is measured by the Faraday cup 18 and the current measuring unit 107 (step S103).

Then, it is judged whether the value I of the measured electric current exceeds the preset value $I_{PRESET}$ or not by the current measuring unit 107 (step S104). When the value I of the measured electric current exceeds the preset value $I_{PRESET}$, (i.e., $I > I_{PRESET}$), the current measuring unit 107 sends the signals B1 and B2 to the exposure-time calculator 108 and the current-density calculator 109, respectively.

In response to the signal B2, the current-density calculator 109 calculates the necessary current density of the electron beam 10, and generates a current-density correction data according to the received signal B2 (Step S105). The current-density correction data is stored in the current-density data memory 102 (Step S107).

Simultaneously, in response to the signal B1, the exposure-time calculator 108 calculates the necessary exposure time, and generates an exposure-time correction data according to the received signal B1 (Step S106). The exposure-time correction data is stored in the exposure-time data memory 106 (Step S107).

The electromagnetic lens controller 101 reads out the current-density correction data stored in the current-density data memory 102 (Step S108), and corrects the current density according to the signal A2 using the correction data (Step S109). At the same time, the blanking-electrode controller 105 reads out the exposure-time correction data stored in the exposure-time data memory 108 (Step S108), and corrects the exposure time according to the signal A3 using the correction data (Step S109).

Subsequently, an exposure process is performed using the corrected current density of the electron beam 10 and the corrected exposure time of the wafer 20 (Step 110).

When the value I of the measured electric current does not exceed the preset value $I_{PRESET}$, (i.e., $I \leq I_{PRESET}$), the data correction steps S105 to S109 are not performed, and an exposure process is immediately performed (Step S110).

The same process steps S1 to S10 are performed for the remaining apertures 16a on the second aperture mask 16, respectively.

Figure 4:
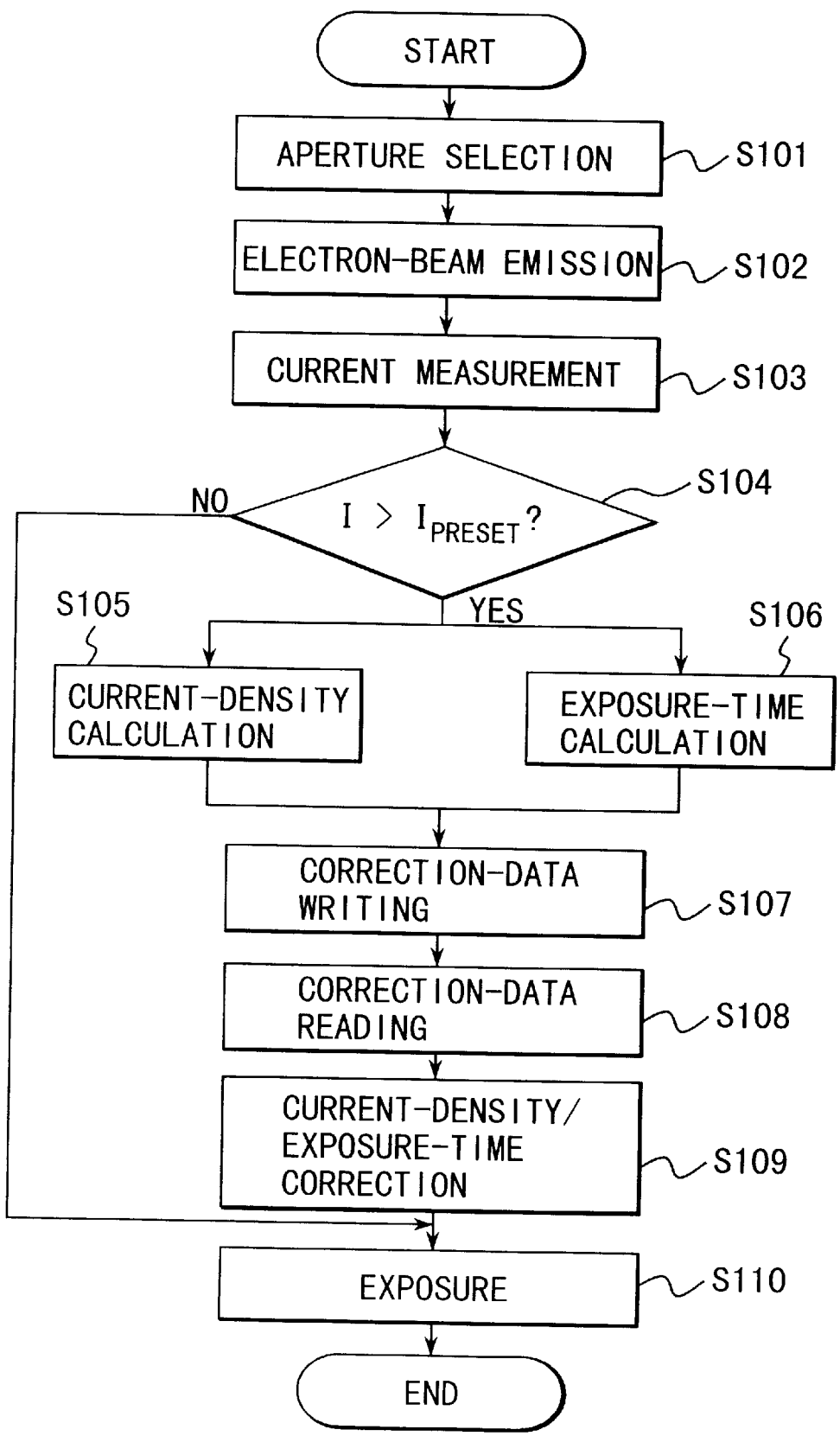
FIG. 4 is a flow chart view showing the process steps of an electron-beam exposure method using the system according to the first embodiment.

In the flow chart of FIG. 4, the above steps S101 to S109 are performed just before the first exposure process of each composite shape of the beam 10 or image. However, the above steps S101 to S109 maybe repeated for all the composite shapes or images at a time during the setting process of the wafer 20 into the column 30 for exposure. In this case, the step S110 are performed after the finish of the repetition of the steps S101 to S109 for all the apertures 16a on the second aperture mask 16.

As described above, with the charged-beam exposure system according to the first embodiment of FIG. 3, when the value I of the detected electric current by the Faraday cup 18 exceeds the preset value $I_{PRESET}$, (i.e., $I > I_{PRESET}$), the current-density calculator 109 and the exposure-time calculator 108 respectively generates the current-density correction data and the exposure-time correction data in such a way that the current density of the charged beam 10 is decreased to the preset value or less and the exposure time of the wafer 20 is increased to keep the amount of exposure substantially unchanged.

The electromagnetic lens controller 101 and the electromagnetic lenses 12a and 12b control the current density of the electron beam 10 according to the current-density correction data. At the same time, the blanking-electrode controller 105 and the blanking electrodes 17 control the exposure time of the wafer 20 according to the exposure-time correction data.

Accordingly, the current density of the composite-shaped electron beam 10 is limited within a proper range and the blur of the beam 10 is prevented from excessively increasing. As a result, a fine pattern is able to be transferred onto the wafer 20 without the use of conventional current-density adjusting apertures which are difficult to be fabricated and high in cost.

Also, the current density of the electron beam 10 is adjusted or changed by the electromagnetic lens controller 101 based on the current-density correction data. Therefore, the current density of the beam 10 can be changed continuously.

Further, the current-density correction data and the exposure-time correction data are respectively generated by the current-density calculator 109 and the exposure-time calculator 108 through the detection of the current density of the electron beam 10 for any selected one of the apertures 16a on the second aperture mask 16. This means that preparation of the data for correcting the current density of the beam 10 and the data for correcting the necessary exposure time is allowed to be performed just before the exposure process.

SECOND EMBODIMENT

An electron-beam cell projection exposure system according to a second embodiment is shown in FIG. 5.

The exposure system according to the second embodiment has the same configuration as that of the first embodiment of FIG. 3 except that a current measuring instrument 28 is provided in the upper vicinity of the second aperture mask 16 instead of the Faraday cup 18. Therefore, the description relating to the same configuration is omitted here for the sake of simplification of description by adding the same reference numerals to the corresponding elements in FIG. 5, respectively.

In FIG. 5, the current measuring instrument 28 detects an electric current generated by a part of the electrons in the rectangular-shaped electron beam 10, which are scattered by the second aperture mask 16. Then, the instrument 28 measures an electric current due to the detected, scattered electrons.

The ratio of the total electric current generated by the scattered electrons to the electric current generated by the detected, scattered electrons, and the ratio of the total electric current generated by the scattered electrons to the electric current generated by the incident electrons are determined or measured in advance. Therefore, the electric current generated by the incident electrons to the second aperture mask 16 can be known with respect to the current generated by the detected, scattered electrons. From the current by the incident electrons thus obtained and the preset total current by the incident electrons, the electric current generated by the composite-shaped electron beam 10 can be calculated.

Accordingly, using the same process steps S101 to S110 or S101 to S109 as shown in FIG. 4, the same advantages as those in the first embodiment is obtained.

THIRD EMBODIMENT

An electron-beam cell projection exposure system according to a third embodiment is shown in FIG. 6.

The exposure system according to the third embodiment has the same configuration as that of the first embodiment of FIG. 3 except that a current measuring instrument 38 is provided in the vicinity of the second aperture mask 16 instead of the Faraday cup 18. Therefore, the description relating to the same configuration is omitted here for the sake of simplification of description by adding the same reference numerals to the corresponding elements in FIG. 6, respectively.

In FIG. 6, the current measuring instrument 38 is electrically connected to the second aperture mask 16. The instrument 38 detects an electric current generated by the incident electrons to the second aperture mask 16 in the electron beam 10, and measures the electric current due to the detected, incident electrons.

The ratio of the total current by the incident electrons to the current by the detected, incident electrons is determined or measured in advance. Therefore, from the current of the detected, incident electrons, and the preset total current by the incident electrons, the electric current generated by the composite-shaped electron beam 10 can be calculated.

Accordingly, using the same process steps S101 to S110 or S101 to S109 as shown in FIG. 4, the same advantages as those in the first embodiment is obtained.

In the above first to third embodiments, the pattern is transferred onto the resist-coated semiconductor wafer 20 with the use of the electron beam 10. However, the present invention may be applied to any other specimen, such as a mask or reticle for lithography in the field of semiconductor device fabrication and others, and an ion beam may be used instead of the electron beam 10.

While the preferred forms of the present invention have been described, it is to be understood that modifications will be apparent to those skilled in the art without departing from the spirit of the invention. The scope of the invention, therefore, is to be determined solely by the following claims.

What is claimed is:

1. A charged-beam exposure system comprising:

a charged-beam source for emitting a charged beam;

a first aperture mask having a first aperture for shaping the charged beam into a first shape;

a second aperture mask having second apertures for selectively shaping the charged beam into second shapes;

a current-density controller for controlling the current density of the charged beam;

a second-aperture selector for selecting one of said second apertures;

an exposure-time controller for controlling the exposure time of a specimen to the charged beam;

a current detector for detecting an electric current generated by the charged beam; and a correction data generator for generating a current-density correction data and an exposure-time correction data;

wherein the charged beam is irradiated to said first aperture to be shaped into said first shape;

and wherein the charged beam shaped into said first shape is further irradiated to a selected one of said second apertures to be shaped into a corresponding one of said second shapes, thereby shaping the charged beam into a composite shape of said first aperture and selected one of said second apertures;

and wherein the charged beam shaped into said composite shape is irradiated to the specimen to form an image of said composite shape on the specimen;

and wherein when the value of said detected electric current by said current detector exceeds a preset value, said correction data generator generates said current-density correction data and said exposure-time correction data in such a way that the current density of the charged beam is decreased to the preset value or less and the exposure time of the specimen is increased to keep the amount of exposure substantially unchanged;

and wherein said current density controller controls the current density of the charged beam according to said current-density correction data, and said exposure-time controller controls the exposure time of the specimen according to said exposure-time correction data.

2. A system as claimed in claim 1 wherein a Faraday cup is used as said detector;

and wherein said Faraday cup is located at a position where the charged beam having passed through the selected one of said second apertures is encountered.

3. A system as claimed in claim 1 wherein an ammeter is used as said detector;

and wherein said ammeter detects an electric current generated by a scattered component of the charged beam by said second aperture mask.

4. A system as claimed in claim 1 wherein an ammeter is used as said detector;

and wherein said ammeter detects an electric current flowing into the selected one of said second apertures.

* * * * *

UNITED STATES PATENT AND TRADEMARK OFFICE
CERTIFICATE OF CORRECTION

PATENT NO. : 5,932,884
DATED : August 3, 1999
INVENTOR(S) : Naoaki AIZAKI

It is certified that error appears in the above-identified patent and that said Letters Patent is hereby corrected as shown below:

Column 8, line 40, delete "16 traps" and insert --18 traps--.

Column 9, line 4, delete "102" and insert --108--.

Signed and Sealed this

First Day of February, 2000

Attest:

Q. TODD DICKINSON

*Attesting Officer*     *Acting Commissioner of Patents and Trademarks*